(12) United States Patent
Inoue et al.

(10) Patent No.: US 9,054,674 B2
(45) Date of Patent: Jun. 9, 2015

(54) ACOUSTIC WAVE FILTER, COMMUNICATION MODULE, AND METHOD FOR MANUFACTURING THE FILTER

(75) Inventors: Kazunori Inoue, Tokyo (JP); Jun Tsutsumi, Tokyo (JP); Kazuhiro Matsumoto, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 536 days.

(21) Appl. No.: 13/425,001

(22) Filed: Mar. 20, 2012

(65) Prior Publication Data

US 2012/0176206 A1   Jul. 12, 2012

Related U.S. Application Data

(63) Continuation of application No. PCT/JP2010/064773, filed on Aug. 31, 2010.

(30) Foreign Application Priority Data

Sep. 28, 2009   (JP) ................... 2009-222661

(51) Int. Cl.
*H03H 9/70* (2006.01)
*H03H 9/72* (2006.01)
(Continued)

(52) U.S. Cl.
CPC ........... *H03H 9/706* (2013.01); *Y10T 29/49155* (2015.01); *H03H 3/02* (2012.01); *H03H 3/08* (2013.01); *H03H 9/02125* (2013.01);
(Continued)

(58) Field of Classification Search
CPC . H03H 9/02125; H03H 9/02913; H03H 3/02; H03H 3/08; H03H 9/02952; H03H 9/568; H03H 9/6483; Y10T 29/49155
USPC ......... 333/133, 187, 189, 193, 194, 195, 196; 310/313 B, 313 D, 340; 29/25.35
See application file for complete search history.

(56) References Cited

U.S. PATENT DOCUMENTS

| | | | |
|---|---|---|---|
| 2004/0090287 A1 | 5/2004 | Fujino et al. | |
| 2004/0155721 A1* | 8/2004 | Cromarty et al. | ............... 333/12 |

(Continued)

FOREIGN PATENT DOCUMENTS

| | | |
|---|---|---|
| JP | 2000-59171 A | 2/2000 |
| JP | 2002-141692 A | 5/2002 |

(Continued)

OTHER PUBLICATIONS

English translation of Written Opinion (PCT/ISA/237) issued in PCT/JP2010/064773 mailed in Nov. 2010. (Japanese Written Opinion and cited references have been submitted in a previous IDS.).

(Continued)

*Primary Examiner* — Benny Lee
*Assistant Examiner* — Jorge Salazar, Jr.
(74) *Attorney, Agent, or Firm* — Chen Yoshimura LLP

(57) ABSTRACT

An acoustic wave filter includes: a substrate; resonators that are arranged on the substrate and excite acoustic waves; a ground terminal on the substrate; interconnection lines interconnecting the resonators and connecting predetermined ones of the resonators to the ground terminal; and a shield electrode disposed so as to be close to and face the interconnection lines.

12 Claims, 11 Drawing Sheets

(51) Int. Cl.
*H03H 9/02* (2006.01)
*H03H 3/02* (2006.01)
*H03H 3/08* (2006.01)
*H03H 9/56* (2006.01)
*H03H 9/64* (2006.01)

(52) U.S. Cl.
CPC ....... *H03H9/02913* (2013.01); *H03H 9/02952* (2013.01); *H03H 9/568* (2013.01); *H03H 9/6483* (2013.01); *H03H 9/725* (2013.01)

(56) References Cited

U.S. PATENT DOCUMENTS

| | | |
|---|---|---|
| 2004/0174090 A1 | 9/2004 | Koshido |
| 2005/0134400 A1* | 6/2005 | Huynh ................ 333/133 |
| 2006/0192462 A1 | 8/2006 | Iwamoto et al. |
| 2007/0013268 A1 | 1/2007 | Kubo et al. |

FOREIGN PATENT DOCUMENTS

| | | |
|---|---|---|
| JP | 2004-129224 A | 4/2004 |
| JP | 2004-173234 A | 6/2004 |
| JP | 2005-33689 A | 2/2005 |
| JP | 2006-60747 A | 3/2006 |
| JP | 2008-28826 A | 2/2008 |
| WO | 2004/105237 A1 | 12/2004 |
| WO | 2006/006343 A1 | 1/2006 |

OTHER PUBLICATIONS

International Search Report (ISR) issued in PCT/JP2010/064773 mailed in Nov. 2010.
Written Opinion (PCT/ISA/237) issued in PCT/JP2010/064773 mailed in Nov. 2010. (Concise Explanation of Relevance: This Written Opinion considers that the some of claims are not described by or obvious over the reference No. 2-5 cited in ISR above.).
Japanese Office Action dated May 28, 2013, in a counterpart Japanese patent application No. 2009-222661.

* cited by examiner

US 9,054,674 B2

ACOUSTIC WAVE FILTER, COMMUNICATION MODULE, AND METHOD FOR MANUFACTURING THE FILTER

CROSS-REFERENCE TO RELATED APPLICATION

This application is a continuation application of PCT/JP2010/064773 filed Aug. 31, 2010 claiming the priority of Japanese Patent Application No. 2009-222661 filed Sep. 28, 2009, the contents of which are herein wholly incorporated by reference.

FIELD

A certain aspect of the present invention relates to an acoustic wave filter, a communication module using such a filter, and a method for manufacturing an acoustic wave filter.

BACKGROUND

Recently, advanced wireless communication devices, which are typically portable telephones, have a multiband system using multiple frequency bands used for communications and a systematization with various functions, and multiple wireless devices have been installed in one communication device. However, downsizing and thinning of the portable telephone have been continuously demanded, and downsizing and thinning of components installed therein have been strongly desired.

Further, there is a strong demand for cost reduction of the devices. Therefore, in many cases, multiple components are incorporated into a module to thus achieve downsizing and cost reduction in mounting the components.

Among the components installed in the wireless communication devices, an acoustic wave filter and a duplexer using such a filter are produced by a method quite different from that for producing semiconductor components. It is therefore difficult to integrate these components on the same substrate. Actually, the acoustic wave filter and the duplexer are mounted separately from the semiconductor components. However, multiband communications in one portable telephone use multiple acoustic wave filters and multiple duplexes suitable for the multiple frequency bands. For the purpose of downsizing and weight lighting, the multiple acoustic wave filters and duplexers should be incorporated into a single module, which is also to be downsized and thinned.

Now, there is a considerable activity in the development of modules in which acoustic wave filters and duplexers are incorporated. In order to downsize the module, the individual acoustic wave filters and duplexers should be arranged on a module substrate as close to each other as possible, and interconnections lines for interconnecting the duplexers should be as close to each other as possible. Further, the acoustic wave filters and the duplexers should be downsized. Therefore, many cases have close arrangements of interconnection lines that interconnect vibration elements in the acoustic wave filter elements and those for interconnecting the acoustic wave filters. The above-mentioned arrangements may raise the following problems. An unwanted electromagnetic coupling may increase between the lines for interconnecting the acoustic wave filters. Another unwanted electromagnetic coupling may increase between the interconnection lines in the module substrate. These unwanted electromagnetic couplings may degrade the rejection characteristics of the acoustic wave filters, and may degrade isolation between the duplexers.

As a problem raised by downsizing of the acoustic wave filters, it is known that a ripple occurs in the frequency characteristic of the pass band of the acoustic wave filter and increases the insertion loss. Japanese Patent Application Publication No. 2008-28826 (Document 1) proposes a structure directed to solving the problem.

SUMMARY

According to an aspect of the present invention, there is provided an acoustic wave filter including: a substrate; resonators that are arranged on the substrate and excite acoustic waves; a ground terminal on the substrate; interconnection lines interconnecting the resonators and connecting predetermined ones of the resonators to the ground terminal; and a shield electrode disposed so as to be close to and face the interconnection lines.

DETAILED DESCRIPTION

In order to solve the above-described problem, the inventors modified a package of an acoustic wave filter and the layer structure of a module substrate on which the acoustic wave filter is mounted, so that unwanted electromagnetic coupling in the module can be suppressed. Further, the inventors found out that further downsizing needs to suppress electromagnetic coupling in the acoustic wave filter, and created a structure capable of suppressing such electromagnetic coupling.

Figure 1:
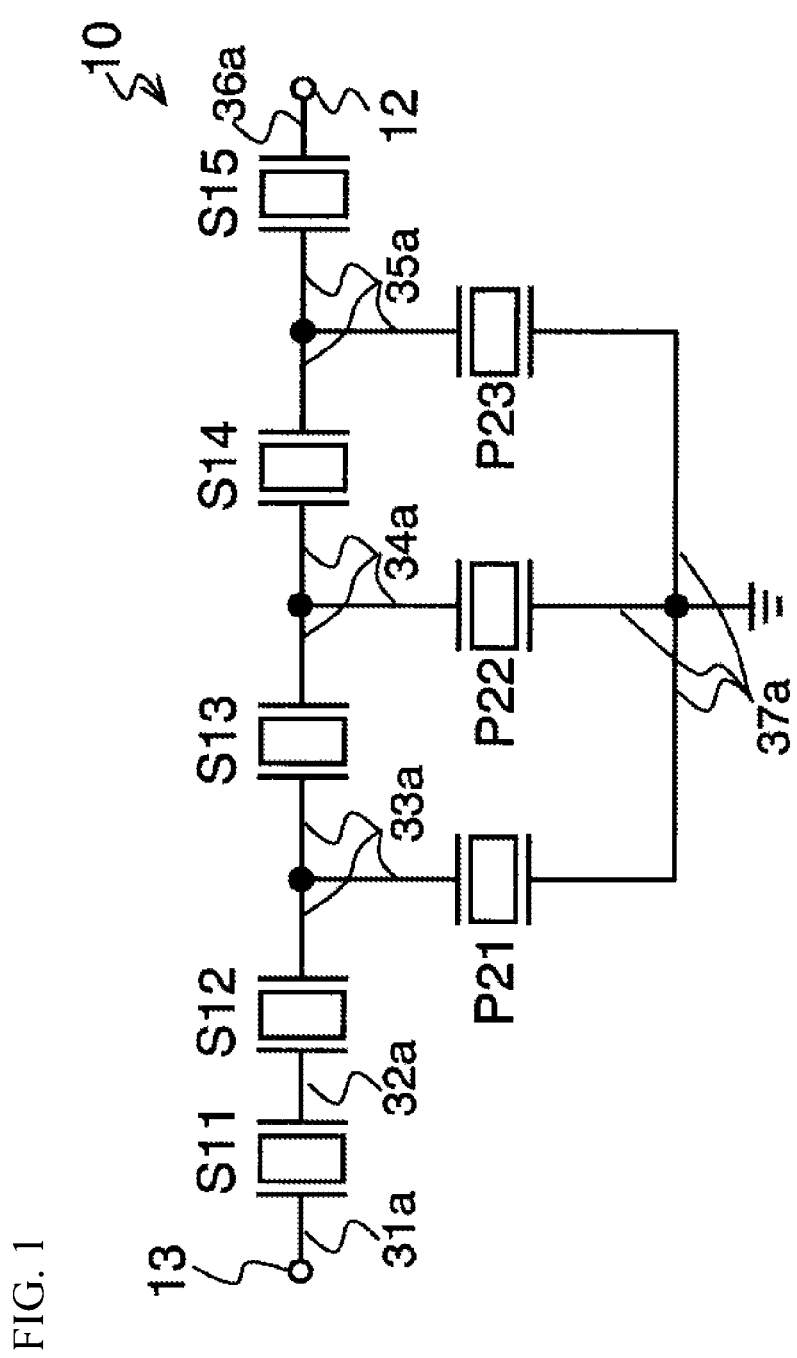
FIG. 1 is a diagram of a circuit configuration of an acoustic wave filter in accordance with a first embodiment.

Embodiments are now described with reference to the accompanying drawings. FIG. 1 is a circuit diagram of a circuit configuration of an acoustic wave filter 10 used in a first embodiment. The acoustic wave filter 10 is an exemplary bandpass filter composed of series resonators S11 through S15 connected in series with each other, and parallel resonators P21 through P23 connected in parallel. Each of the above resonators may be a surface acoustic wave (SAW) element or a film bulk acoustic resonator (FBAR), for example. The following description assumes that each resonator is FBAR. The series resonators S11~S15 and the parallel resonators P21~P23 are formed on a silicon substrate, and are electrically connected as illustrated in FIG. 1 by interconnection lines 31*a* through 37*a* made of ruthenium (Ru), aluminum (Al), copper (Cu), molybdenum (Mo), tungsten (W), tantalum (Ta), platinum (Pt), rhodium (Rh), iridium (Ir) or the like. Electrodes for applying an electric field to a piezoelectric film of FBAR include an upper electrode and a lower electrode, which are distinguished from the interconnection lines in the description. However, the upper and lower electrodes are preferably made of the same material as that of the interconnection lines, which may be formed by patterning.

Figure 2:
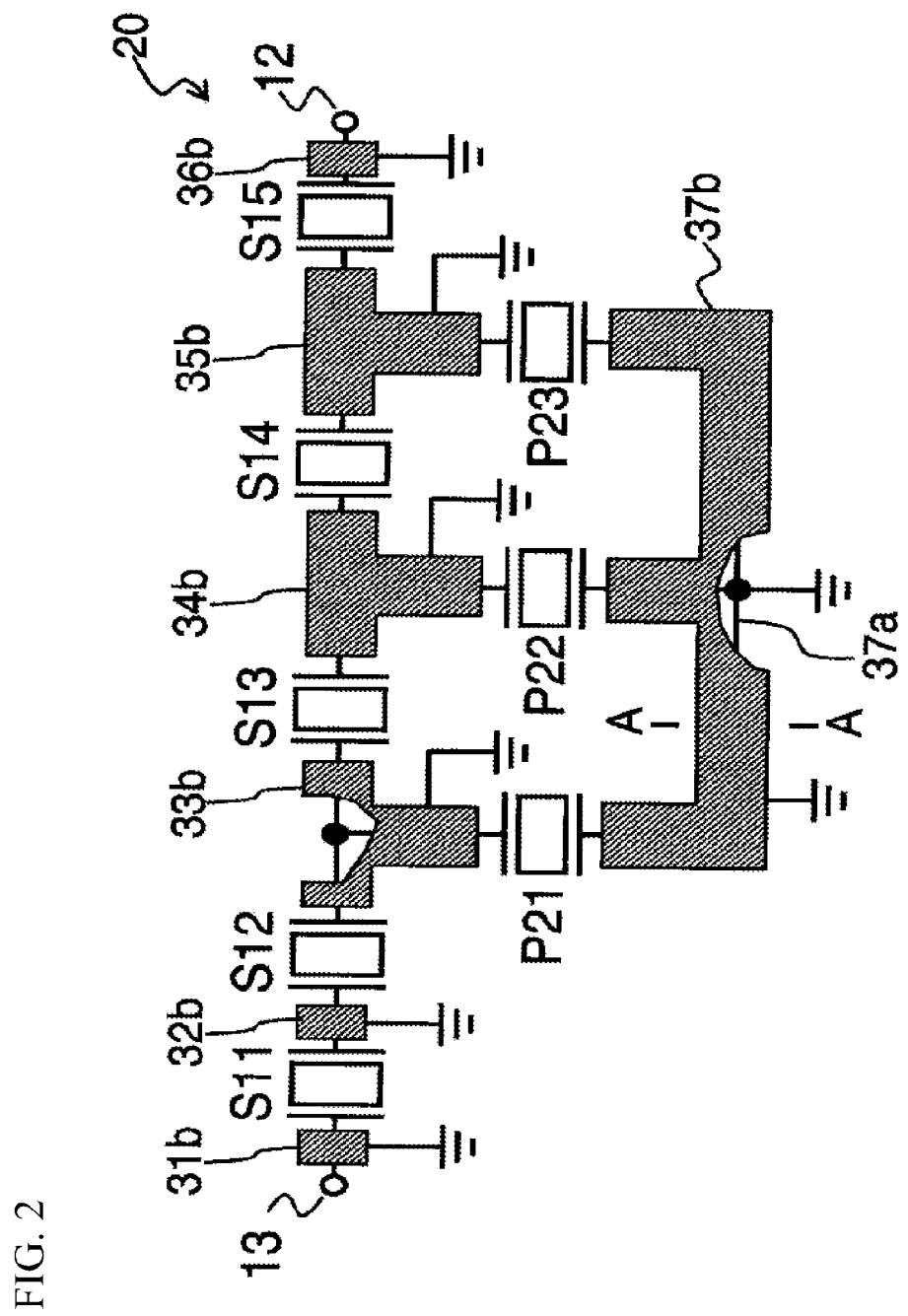
FIG. 2 is a diagram of another circuit configuration of the acoustic wave filter in accordance with the first embodiment.
Figure 3:
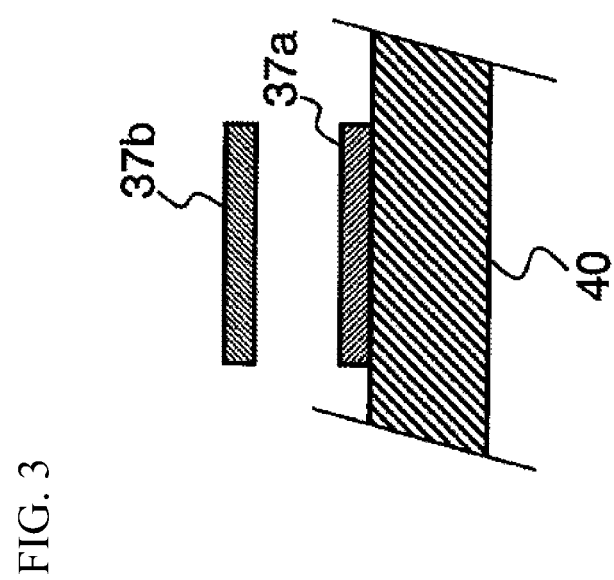
FIG. 3 is a cross-sectional view taken along a line A-A illustrated in FIG. 2.

FIG. 2 is a diagram of a circuit configuration of an acoustic wave filter 20 in which shield electrodes 31*b* through 37*b* are arranged along the interconnection lines 31*a* through 37*a* between the resonators of the acoustic wave filter 10 so that the shield electrodes 31*b* through 37*b* are vertically spaced apart from the interconnection lines 31*a* through 37*a* by a given distance. The widths of the shield electrodes 31*b* through 37*b* are preferably larger than those of the corresponding interconnection lines 31*a* through 37*a*. The shield electrodes 31*b* through 37*b* are grounded. FIG. 3 is a cross-sectional view taken along a line A-A in FIG. 2, and illustrates a positional relationship between the interconnection pattern and the shield electrode in the direction perpendicular to the drawing sheet. As illustrated in FIG. 3, the interconnection line 37*a* is formed on a substrate 40, and the shield electrode 37*b* is vertically spaced apart from the interconnection line 37*a* by a given distance.

The spacing between the interconnection line 37*a* and the shield electrode 37*b* may be empty or may be full of a dielectric material for mechanically stabilizing the shield electrode 37*b*. A method for forming the shield electrodes 31*b* through 37*b* will be described later.

Figure 4:
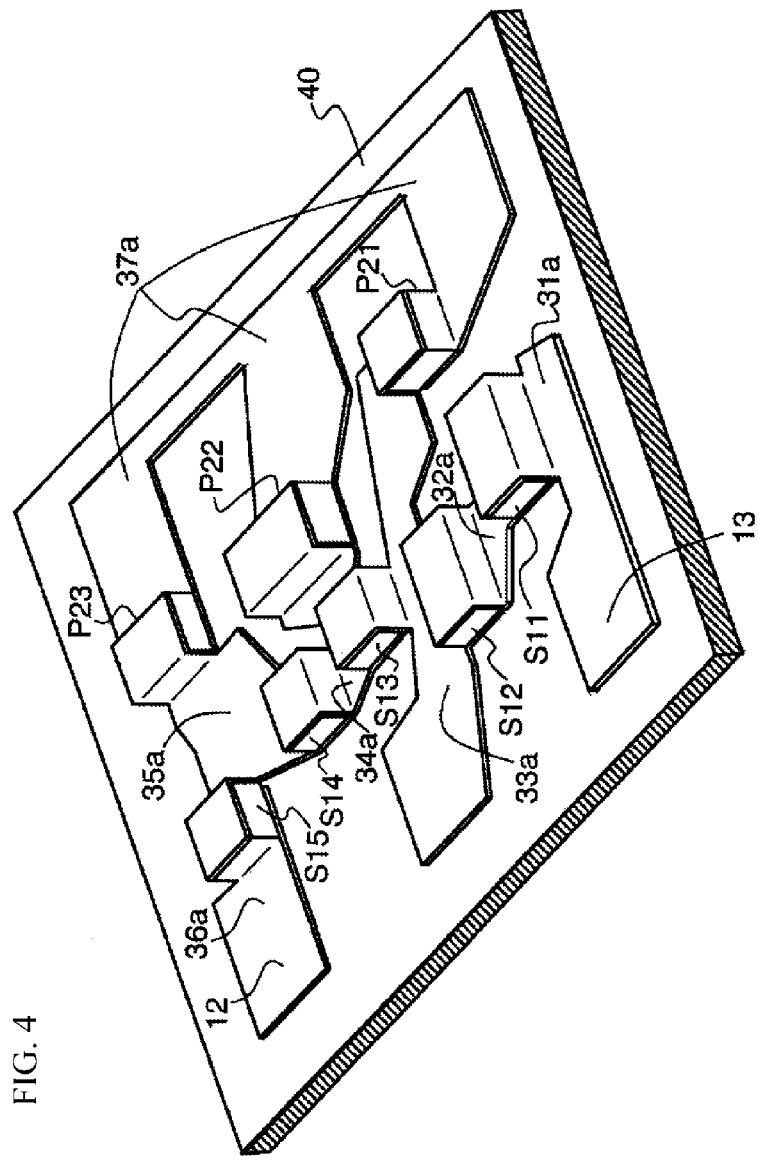
FIG. 4 is a perspective view of the acoustic wave filter in accordance with the first embodiment.
Figure 5:
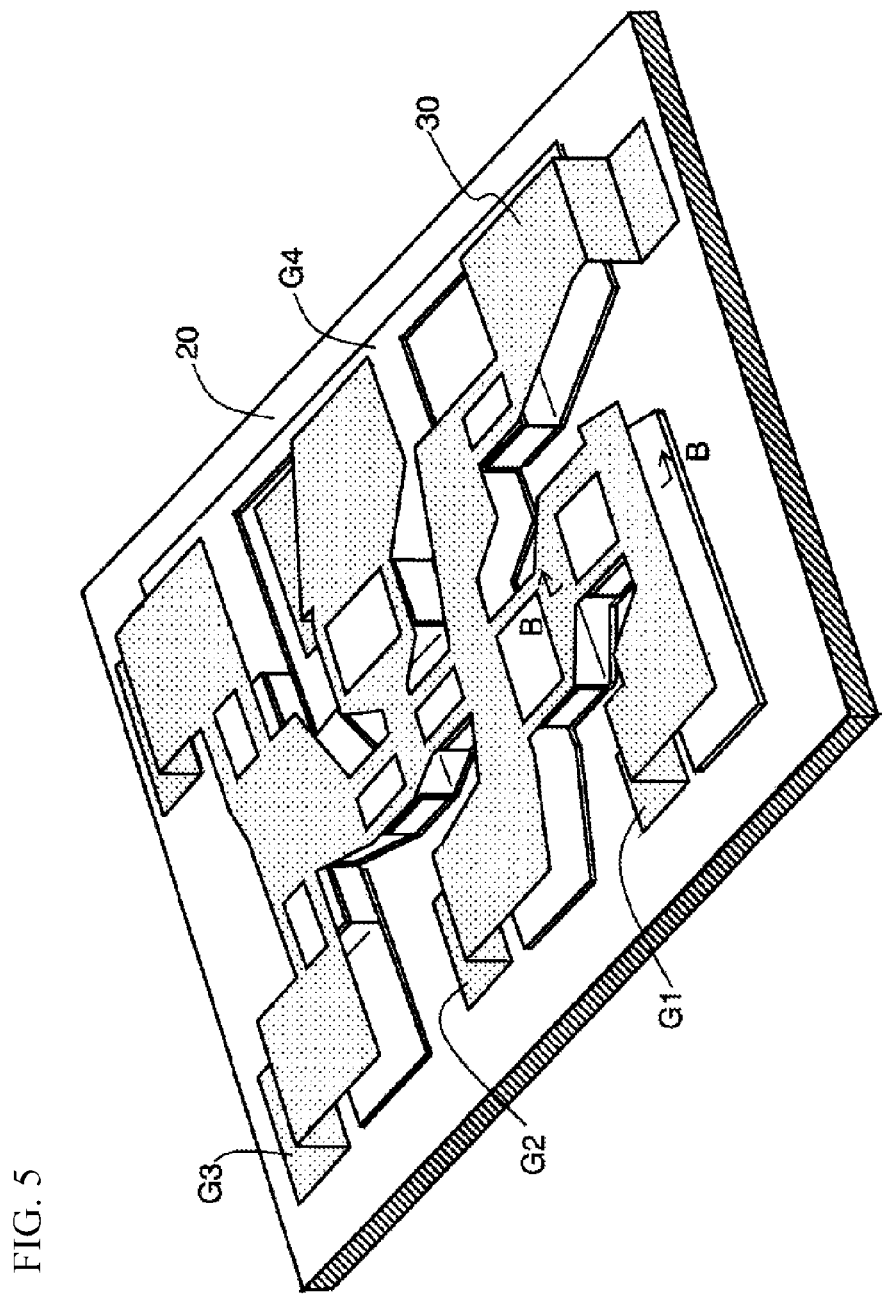
FIG. 5 is another perspective view of the acoustic wave filter in accordance with the first embodiment.
Figure 6:
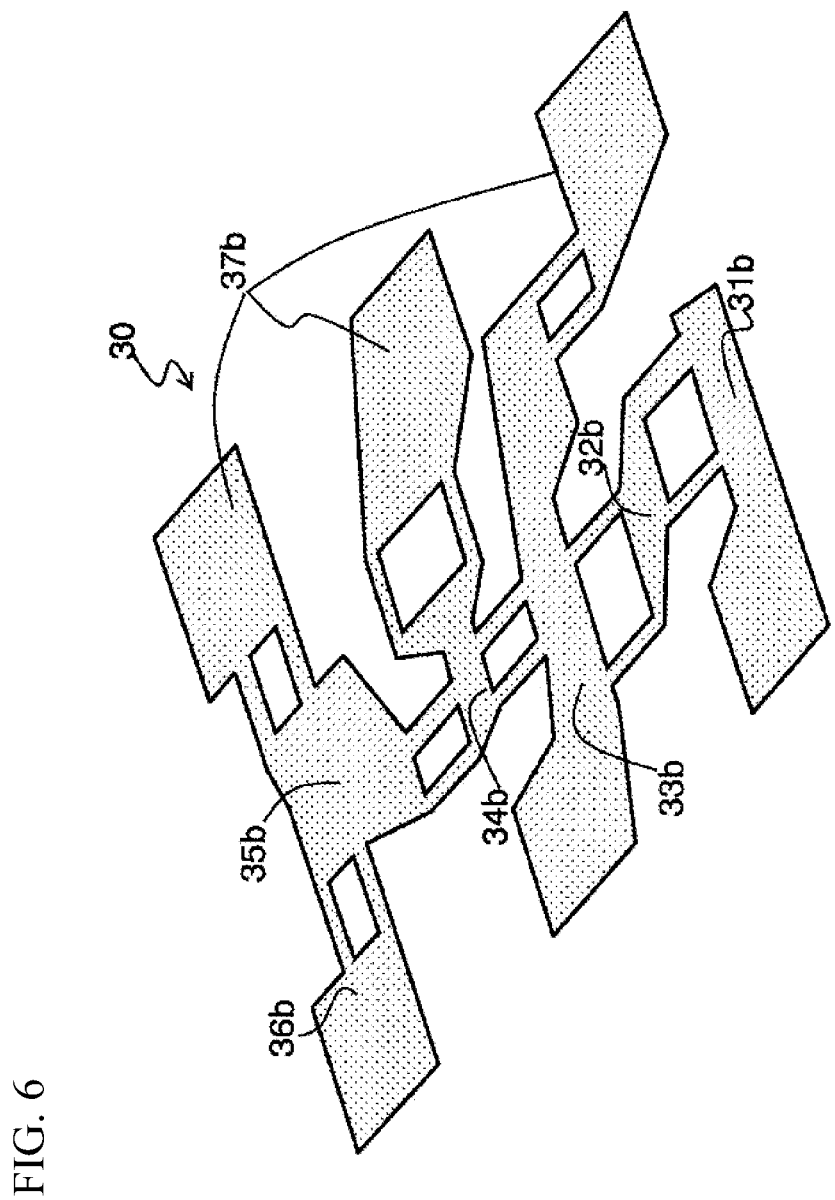
FIG. 6 is a perspective view of a shield electrode.
Figure 7:
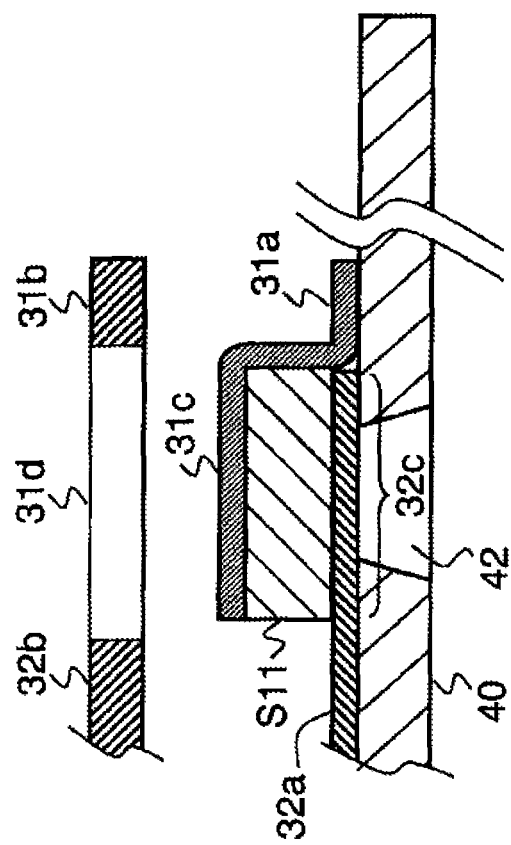
FIG. 7 is a cross-sectional view taken along a line B-B in FIG. 5.

FIG. 4 illustrates the acoustic wave filter 10 illustrated in FIG. 1, and FIG. 5 illustrates an arrangement of an shield electrode above the interconnection lines of the acoustic wave device. FIG. 6 illustrates only the shield electrodes 31*b* through 37*b*, and FIG. 7 is a cross-sectional view of the shield electrode 31*b*, the resonator and the substrate. In FIGS. 5 and 6, only one acoustic wave filter 10 (acoustic wave filter 20) is illustrated. However, multiple filters may be provided.

FIG. 4 is a perspective view of the acoustic wave filter 10 not having the shield electrodes. As illustrated in FIG. 4, the interconnection lines 31*a* though 37*a* are integrally formed with the upper or lower electrodes of the series resonators S11 through S15 and the parallel resonators P21 through P23. The input terminal 13 and the output terminal 12 illustrated in FIG. 1 are integrally formed with the interconnection lines 31*a* and 36*a*.

FIG. 5 is a perspective view of a structure in which a shield electrode 30 is provided on the acoustic wave filter 10 illustrated in FIG. 4. Although the shield electrodes 31*b* through 37*b* are separated parts in FIG. 2, the shield electrodes 31*b* trough 37*b* are preferably formed into a single shield electrode 30. The shield electrode 30 covers the interconnection lines 31*a* through 37*a* between the resonators, and has openings above the resonators. The integrated shield electrode 30 have four ground terminals G1 through G4 in FIG. 5. However, the number of ground terminals and the positions thereof are not limited to those in FIG. 5.

FIG. 6 illustrates only flat portions of the shield electrode 30 in order to facilitate easy understanding of the shield electrode 30. In FIG. 6, folded portions of the shield electrode 30 for forming the ground terminals are omitted.

The shield electrode 30 may be made of the same material as that of the upper and lower electrodes.

FIG. 7 is a cross-sectional view taken along a line B-B in FIG. 5. An upper electrode 31*c* of the resonator S11 of FBAR type is integrally formed with the patterned interconnection line 31*a*, and a lower electrode 32*c* thereof is integrally formed with an interconnection line 32*a*. The substrate 40 has a cavity 42 below the lower electrode 32*c* in order to improve the Q value of the resonator S11. The cavity 42 is not limited to an opening formed in the substrate 40 but may be a portion having a small acoustic impedance. For example, the cavity 42 may be replaced by a curved or dome-shaped gap defined by curving the resonator S11 so as to be away from the substrate 40. The shield electrodes 31*b* and 32*b* are disposed above the interconnection lines 31*a* and 32*a* at given intervals. An opening 31*d* is located above the resonator S11.

The shield electrodes are preferably wider than the patterned interconnection lines because such wider shield electrodes are capable of effectively suppressing the electromagnetic couplings between the interconnection lines.

The spacings between the interconnection lines and the shield electrodes may include an empty spacing, a dielectric layer, or both of an empty spacing and a dielectric layer.

The shield electrodes may be disposed so as to be close to and face at least one of the interconnection lines that is not grounded.

The shield electrodes may be electrically connected to an electrode of at least one of the resonators that is connected to ground.

A description is now given of characteristics of the acoustic wave filters of the present embodiment. The acoustic wave filter 10 does not have the shield electrode 30. An acoustic wave filter 20 has the shield electrode 30. The characteristics of the acoustic wave filters 10 and 20 are obtained by computer simulation under the following conditions.

(1) The characteristic of each resonator of each filter is computed by the mode-mode coupling theory.

(2) The characteristics of the entire filters including the interconnection lines and the shield electrodes are computed by three-dimensional electromagnetic field analyzing software.

(3) The pass bands of the filters are those of a reception filter of BAND1 (a band of 2110 MHz to 2170 MNz).

(4) The distance between the interconnection lines of the acoustic wave filter 20 and the shield electrodes is 15 μm. Since the acoustic wave filter 10 does not have the shield electrodes, the simulation assumes that the distance is 100 μm.

Figure 8:
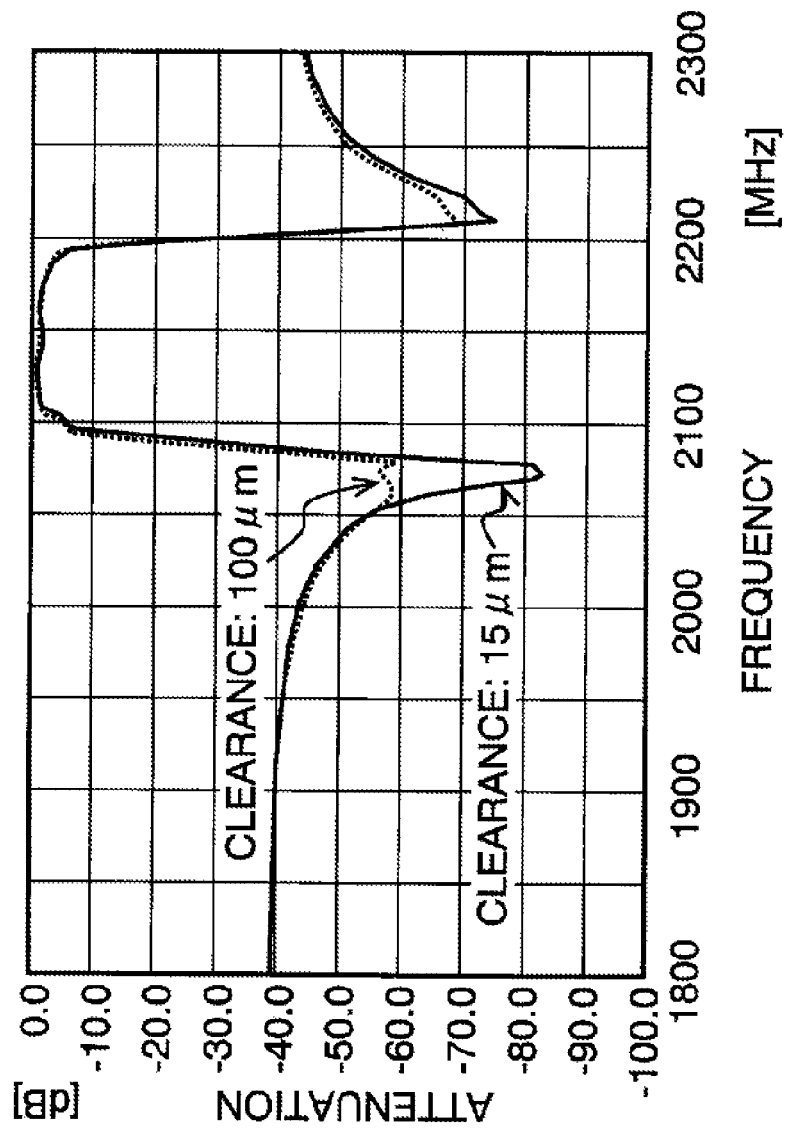
FIG. 8 is a diagram of characteristics of the acoustic wave filter of the first embodiment and an acoustic wave filter of a comparative example.

The computation results of the pass characteristics of the acoustic wave filters 10 and 20 under the above conditions are illustrated in FIG. 8. The horizontal axis of FIG. 8 denotes the frequency, and the vertical axis denotes the amount of attenuation. A solid line indicates the pass band characteristic of the acoustic wave filter 20 of the present embodiment, and a dotted line indicates that of the acoustic wave filter 10, which is also referred to as a comparative example. It can be seen from FIG. 8 that the acoustic wave filter 20 has an improved suppression ratio on both sides of the pass band. Particularly, there is a large attenuation peak at around 2070 MHz, and the suppression is greatly improved by about twenty and a few dB.

A description is now given, with reference to FIGS. 9A through 9E and 10A through 10F, of a method for manufacturing the acoustic wave filter 20 of the present embodiment. FIGS. 9A through 9E illustrate a part of the acoustic wave filter 20 configured so that a dielectric layer is provided between the interconnection line and the shield electrode. FIGS. 10A through 10F illustrate a part of the acoustic wave filter 20 configured so that an empty spacing is provided between the interconnection pattern and the shield electrode.

Referring to FIGS. 9A through 9E, the shield electrode of the acoustic wave filter 20 is formed as follows. It is now assumed that the resonators and the interconnection lines of the acoustic wave filter 20 have been formed by a known process.

Figure 9A:
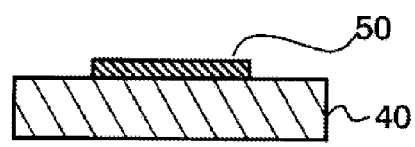
FIGS. 9A through 9E are diagrams of a method for manufacturing an acoustic wave device having a dielectric layer between an interconnection line and a shield electrode.
Figure 9B:
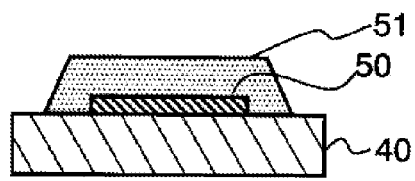
Figure 9C:
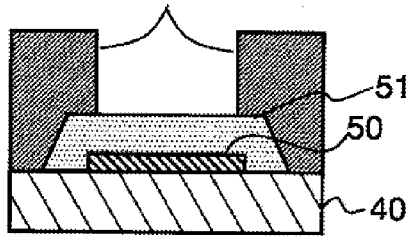
Figure 9D:
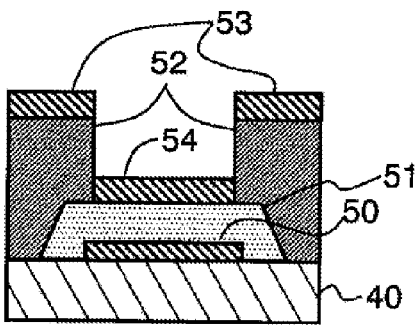
Figure 9E:
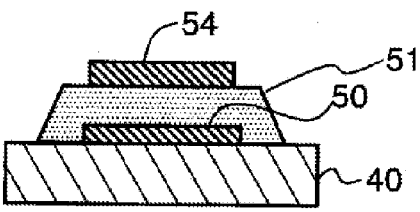

Referring to FIG. 9A, an interconnection line 50 formed by patterning has been formed on the substrate 40 by a known process. The interconnection line 50 is one of the interconnection lines 31a through 37a. Next, an insulative layer made of a dielectric material is formed on the interconnection line 50. Since the thickness of the dielectric layer on the interconnection line 50 is preferably a few μm or more, the dielectric film is formed by depositing photosensitive polyimide 51 and sintering it after patterning, as illustrated in FIG. 9B. Then, the shield electrode is formed by a liftoff process in which resist 52 is patterned so as to remove a portion in which the shield electrode is to be removed to expose the photosensitive polyimide 51, as illustrated in FIG. 9C. After that, as illustrated in FIG. 9D, a metal layer is formed on the whole surface by a vapor deposition process. The metal layer on the resist 52 is indicated by a reference numeral 53, and that in the opening is indicated by a reference numeral 54. Finally, the resist is removed, so that the metal layer 54 remaining in the opening is the shield electrode.

A description is now given, with reference to FIGS. 10A through 10F, of the method for manufacturing the acoustic wave filter 20 in which an empty spacing is formed between the shield electrode and the interconnection line. It is now assumed that the resonators and the interconnection lines of the acoustic wave filter 20 have been formed by a known process. It is preferable that an empty spacing is formed between the interconnection line and the shield electrode, as compared with the use of the dielectric layer. This is because the capacitance between the interconnection line and the shield electrode facing each other through the empty spacing has a small capacitance, as compared with the capacitor in which the interconnection line and the shield electrode face each other through the dielectric layer. The use of the empty spacing needs a support post for holding the shield electrode.

Figure 10A:
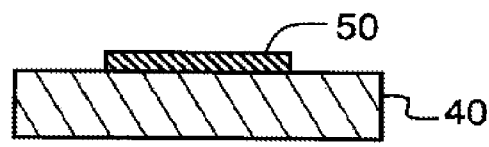
FIGS. 10A through 10F are diagrams of a method for manufacturing an acoustic wave device having an empty spacing between an interconnection line and a shield electrode.
Figure 10B:
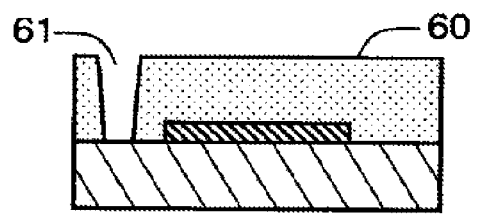
Figure 10C:
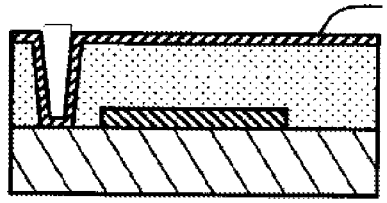
Figure 10D:
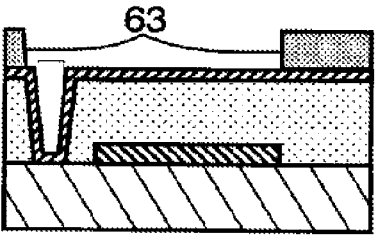
Figure 10E:
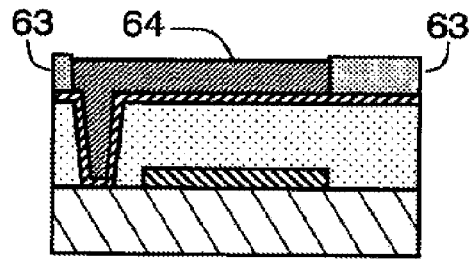
Figure 10F:
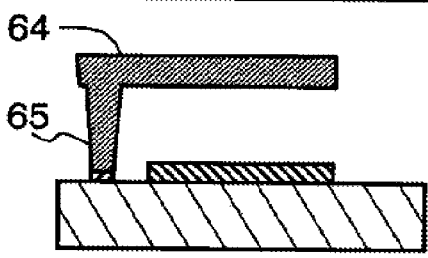

FIG. 10A is a cross-sectional view of the substrate 40 on which the interconnection line 50 is formed. As illustrated in FIG. 10B, a pattern of a support pattern 61 for holding a shield electrode is formed by patterning a resist 60. The support pattern 61 may have a cylindrical shape or a circular truncated cone shape. Next, as illustrated in FIG. 10C, a seed electrode 62 for plating is formed by sputtering or the like. Subsequently, as illustrated in FIG. 10D, an opening is formed by resist 63 for forming a shield electrode 64. After that, as illustrated in FIG. 10E, the opening is filled with a metal formed into the shield electrode 64 by plating. Finally, as illustrated in FIG. 10F, the resist 63 is removed, whereby the shield electrode 64 and the support post 65 are formed. The support post 65 is electrically conductive and is connected to the shield electrode 64. Since the shield electrode 64 is an interconnection line in the air, the main portion of the shield electrode 64 is preferably plated with Cu taking stress into account. That is, the shield electrode 64 and the support post 65 have Cu as a main component.

Figure 11:
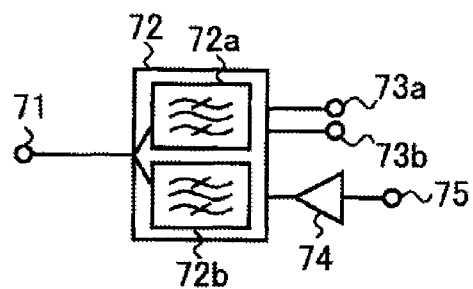
FIG. 11 is a block diagram of a duplexer having filters of the first embodiment in accordance with a second embodiment.

FIG. 11 is a block diagram of an exemplary communication module in accordance with a second embodiment having acoustic wave filters, each of which is configured in accordance with the first embodiment. Referring to FIG. 11, a duplexer 72 includes a reception filter 72a and a transmission filter 72b. Reception terminals 73a and 73b for balance output are connected to the reception filter 72a. The transmission filter 72b is coupled with a transmission terminal 75 via a power amplifier 74. The reception filter 72a and the transmission filter 72b include the acoustic wave filters of the first embodiment.

In reception operation, the reception filter 72a passes only signals in a predetermined frequency band among signals received via an antenna terminal 71, and outputs these signals to the outside of the duplexer via the reception terminals 73a and 73b. In transmission operation, the transmission filter 72b passes only signals in a predetermined frequency band among signals applied via the transmission terminal 75 and amplified by the power amplifier 74, and outputs these signals to the outside of the duplexer via the antenna terminal 71. The communication module of the present invention is not limited to the structure illustrated in FIG. 11 but may have another structure in which at least one acoustic wave device of the present invention is used. Such a communication module has effects similar to those of the communication module illustrated in FIG. 11.

Figure 12:
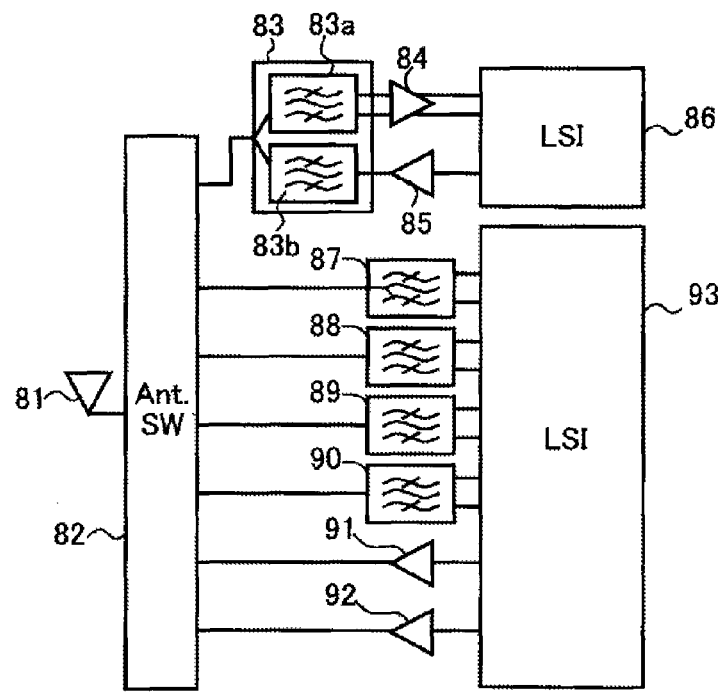
FIG. 12 is a block diagram of a communication module in accordance with a third embodiment, wherein the module has filters of the first embodiment and the duplexer of the second embodiment in accordance with the first embodiment.

FIG. 12 is a block diagram of an RF block of a portable telephone as a communication device equipped with a communication module in accordance with a second embodiment. The structure illustrated in FIG. 12 conforms to GSM (Global System for Mobile Communications) and W-CDMA (Sideband Code Division Multiple Access). The portable telephone has a microphone, a speaker and a liquid display in addition to the structure illustrated in FIG. 12. However, these components are not needed when the present embodiment is described, and are therefore omitted in FIG. 12. Reception filters 83a, 87, 88, 89 and 90, and a transmission filter 83b include the acoustic wave filters of the first embodiment or the duplexers of the second embodiment.

A signal received via an antenna 81 is distributed to an appropriate LSI by an antenna switch circuit 82 on the basis of whether the received signal conforms to the W-CDMA or GSM. When the received signal conforms to W-CDMA, the switch 82 forms a path to output the received signal to the duplexer 83. The received signal applied to the duplexer 83 is limited to the predetermined frequency band by the reception filter 83a, and is output to a low-noise amplifier (LNA) 84 in the form of balanced output. The LNA 84 amplifies the received signal, and outputs the amplified signal to an LSI 86, which performs a demodulation process on the received signal for reproduction of the original audio signal, and controls various parts of the portable telephone.

In transmission operation, the LSI 86 generates a transmission signal, which is amplified by a power amplifier 85 and is applied to the transmission filter 83b. The transmission filter 83b passes only signals in the predetermined frequency band among the signals received from the power amplifier 85. The transmission signal from the transmission filter 83b is output to the outside of the communication device via the antenna switch circuit 82 and the antenna 81.

When the reception signal conforms to GSM, the antenna switch circuit 82 selects one of the reception filters 87~90 in accordance with the frequency band used, and outputs the reception signal to the selected reception filter. The reception signal is limited to the frequency band realized by the selected one of the reception filters 87~90, and is applied to an LSI 93.

The LSI 93 performs a demodulation process on the received signal for reproduction of the original audio signal, and controls various parts of the portable telephone. When a signal is to be transmitted, the LSI 93 generates a transmission signal, which is then amplified by a power amplifier 91 or 92, and is output to the outside of the communication device via the antenna switch circuit 82 and the antenna 81.

The present invention is not limited to the specifically described embodiments, but may include other embodiments and variations without departing from the scope of the present invention.

What is claimed is:

1. An acoustic wave filter comprising:
    a substrate;
    resonators that are arranged on the substrate and excite acoustic waves;
    a ground terminal on the substrate;
    interconnection lines interconnecting the resonators and connecting predetermined ends of the resonators to the ground terminal; and
    shield electrodes disposed so that respective ones of the shield electrodes are close to and face corresponding ones of the interconnection lines,
    wherein the shield electrodes are formed into a single shield electrode having openings, and respective ones of the openings are formed above corresponding ones of the resonators.

2. The acoustic wave filter according to claim 1, wherein the shield electrodes further have portions that extend along the interconnection lines and have a width larger than that of the interconnection lines.

3. The acoustic wave filter according to claim 1, further comprising at least one of a dielectric layer and an empty spacing provided between the interconnection lines and the shield electrodes.

4. The acoustic wave filter according to claim 1, wherein at least one of the shield electrodes is not connected to the ground terminal.

5. The acoustic wave filter according to claim 1, wherein at least one of the shield electrodes is connected to the ground terminal.

6. The acoustic wave filter according to claim 1, wherein at least one of the shield electrodes is connected to an interconnection line of at least one of the resonators that is connected to the ground terminal.

7. The acoustic wave filter according to claim 1, wherein the single shield electrode has a support post that holds at least one of the shield electrodes on the substrate and the post is electrically conductive.

8. The acoustic wave filter according to claim 7, wherein the support post is formed of plated metal.

9. The acoustic wave filter according to claim 8, wherein the support post includes copper as a main component.

10. A duplexer comprising filters, at least one of the filters including:
    a substrate;
    resonators that are arranged on the substrate and excite acoustic waves;
    a ground terminal on the substrate;
    interconnection lines interconnecting the resonators and connecting predetermined ends of the resonators to the ground terminal; and
    shield electrodes disposed so that respective ones of the shield electrodes are close to and face corresponding ones of the interconnection lines,
    wherein the shield electrodes are formed into a single shield electrode having openings, and respective ones of the openings are formed above corresponding ones of the resonators.

11. A communication module comprising a filter and a signal circuit connected to the filter, the filter including:
    a substrate;
    resonators that are arranged on the substrate and excite acoustic waves;
    a ground terminal on the substrate;
    interconnection lines interconnecting the resonators and connecting predetermined ends of the resonators to the ground terminal; and
    shield electrodes disposed so that respective ones of the shield electrodes are close to and face corresponding ones of the interconnection lines,
    wherein the shield electrodes are formed into a single shield electrode having openings, and respective ones of the openings are formed above corresponding ones of the resonators.

12. A method for manufacturing an acoustic wave filter, comprising:
    forming, on a substrate, resonators exciting acoustic waves and interconnection lines interconnecting the resonators;
    forming a dielectric layer so as to cover the interconnection lines;
    forming a pattern having an opening on the dielectric layer by resist;
    forming a metal layer in the opening; and
    removing the resist,
    the metal layer being a shield layer that is close to and face the interconnection lines through the dielectric layer.

* * * * *